United States Patent
Ogawa

(10) Patent No.: US 12,512,815 B2
(45) Date of Patent: Dec. 30, 2025

(54) FILTER DEVICE AND HIGH-FREQUENCY FRONT-END CIRCUIT PROVIDED WITH THE SAME

(71) Applicant: Murata Manufacturing Co., Ltd., Nagaokakyo (JP)

(72) Inventor: Keisuke Ogawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 240 days.

(21) Appl. No.: 18/238,661

(22) Filed: Aug. 28, 2023

(65) Prior Publication Data
US 2024/0097651 A1 Mar. 21, 2024

(30) Foreign Application Priority Data

Sep. 15, 2022 (JP) .................................. 2022-147255
Mar. 10, 2023 (JP) .................................. 2023-037586

(51) Int. Cl.
*H03H 9/54* (2006.01)

(52) U.S. Cl.
CPC .................................. *H03H 9/545* (2013.01)

(58) Field of Classification Search
CPC ......... H03H 7/0115; H03H 2001/0085; H03H 7/09; H03H 7/1775; H03H 7/1708; H03H 7/0161; H03H 7/1725; H03H 7/075; H03H 2001/0078; H03H 7/1766; H01G 4/40; H01G 4/30; H01G 4/012; H01G 4/38; H01F 17/0013; H01F 2017/0026; H01F 27/2804; H01F 2027/2809; H01F 27/29; H01F 27/292; H01F 27/40; H01F 27/00

See application file for complete search history.

(56) References Cited

U.S. PATENT DOCUMENTS

| | | | |
|---|---|---|---|
| 12,301,196 B2 * | 5/2025 | Taniguchi | H01G 4/30 |
| 2013/0229241 A1 * | 9/2013 | Imamura | H03H 7/1791 333/185 |
| 2019/0181826 A1 * | 6/2019 | Imamura | H03H 7/1775 |
| 2023/0188111 A1 | 6/2023 | Ogawa | |

FOREIGN PATENT DOCUMENTS

WO 2022/071191 A1 4/2022

* cited by examiner

*Primary Examiner* — Lincoln D Donovan
*Assistant Examiner* — Tyler J Pereny
(74) *Attorney, Agent, or Firm* — Keating & Bennett, LLP

(57) ABSTRACT

A filter device includes a main body, an input terminal, an output terminal, a ground terminal, and resonators. The resonators are located in the main body and are electromagnetically coupled with each other so as to transmit a signal from the input terminal to the output terminal. Each of the resonators includes a first path connected from nodes via capacitors to the ground terminal, and a second path connected from the nodes to the ground terminal without passing through the capacitors. The second path of a first resonator and the second path of a second resonator are partially shared. The filter device further includes a third path connected with the node of the first resonator and the node of the second resonator.

20 Claims, 11 Drawing Sheets

FILTER DEVICE AND HIGH-FREQUENCY FRONT-END CIRCUIT PROVIDED WITH THE SAME

CROSS REFERENCE TO RELATED APPLICATIONS

This application claims the benefit of priority to Japanese Patent Application No. 2022-147255 filed on Sep. 15, 2022 and Japanese Patent Application No. 2023-037586 filed on Mar. 10, 2023. The entire contents of these applications are hereby incorporated herein by reference.

BACKGROUND OF THE INVENTION

1. Field of the Invention

The present disclosure relates to a filter device and a high-frequency front-end circuit including the filter device, and more specifically relates to a configuration for improving filter characteristics of a filter device including a plurality of resonators.

2. Description of the Related Art

International Publication No. 2022/071191 discloses a multilayer filter device including a plurality of stages of resonators. In such a filter device, filter characteristics can be adjusted based on a coupling degree between resonators.

SUMMARY OF THE INVENTION

For example, increase of a coupling degree between resonators is sometimes realized by adjusting inductance values of inductors of the corresponding resonators. The adjustment by increasing inductance values requires elongation of electrodes or vias of inductors. However, this case increases an overall size of a device, which may make it impossible to achieve a desired product size of products that require miniaturization and a low profile.

On the other hand, when adjustment is performed by reducing inductance values, capacitance values of capacitors of resonators are required to be increased so as to realize a desired resonant frequency. This case presents a possibility that an electrode area defined by the capacitor cannot be secured or impedance of the resonator is reduced, making it impossible to obtain desired filter characteristics.

Preferred embodiments of the present disclosure increase a coupling degree between resonators while preventing an increase in a device size in a multilayer filter device including a plurality of stages of resonators.

A filter device according to a first aspect of a preferred embodiment of the present disclosure includes a main body, an input terminal, an output terminal, a ground terminal, a first resonator, and a second resonator. The first resonator and the second resonator are located in the main body and are electro-magnetically coupled with each other so as to transmit a signal from the input terminal to the output terminal. Each of the first resonator and the second resonator includes a first path that is connected from a first node via a capacitor to the ground terminal, and a second path that is connected from the first node to the ground terminal without passing through a capacitor. The second path of the first resonator and the second path of the second resonator are partially shared. The filter device further includes a third path that is connected with the first node of the first resonator and the first node of the second resonator.

A filter device according to a second aspect of a preferred embodiment of the present disclosure includes an input terminal, an output terminal, a ground terminal, a first resonator, and a second resonator. The first resonator and the second resonator are electro-magnetically coupled with each other so as to transmit a signal from the input terminal to the output terminal. The first resonator includes a first capacitor that is connected between a first node and the ground terminal, a first inductor including a first end that is connected to the first node, a second inductor that is connected with a second end of the first inductor, and a common inductor that is connected between the second end of the second inductor and the ground terminal. The second resonator includes a second capacitor that is connected between a second node and the ground terminal, a third inductor including a first end that is connected to the second node, and a fourth inductor that is connected between a second end of the third inductor and the common inductor. The filter device further includes a fifth inductor that is connected between the second end of the first inductor and the second end of the third inductor.

A filter device according to a third aspect of a preferred embodiment of the present disclosure includes a main body, an input terminal, an output terminal, a ground terminal, a fifth resonator, and a sixth resonator. The fifth resonator and the sixth resonator are located in the main body and are electro-magnetically coupled with each other so as to transmit a signal from the input terminal to the output terminal. The fifth resonator includes a third capacitor that is connected between a third node and the input terminal, a sixth inductor including a first end that is connected to the third node, a seventh inductor that is connected with a second end of the sixth inductor, and a common inductor that is connected between the second end of the seventh inductor and the ground terminal. The sixth resonator includes a fourth capacitor that is connected between a fourth node and the ground terminal, an eighth inductor including a first end that is connected to the fourth node, and a ninth inductor that is connected between the second end of the eighth inductor and the common inductor. The filter device further includes a tenth inductor that is connected between the second end of the sixth inductor and the second end of the eighth inductor.

A filter device according to a fourth aspect of a preferred embodiment of the present disclosure includes a main body, an input terminal, an output terminal, a ground terminal, a fifth resonator, and a seventh resonator. The fifth resonator and the seventh resonator are located in the main body and are electro-magnetically coupled with each other so as to transmit a signal from the input terminal to the output terminal. The fifth resonator includes a third capacitor that is connected between a third node and the input terminal, a sixth inductor including a first end that is connected to the third node, a seventh inductor that is connected with the second end of the sixth inductor, and a common inductor that is connected between the second end of the seventh inductor and the ground terminal. The seventh resonator includes a sixth capacitor that is connected between a fourth node and the output terminal, an eighth inductor including a first end that is connected to the fourth node, and a ninth inductor that is connected between a second end of the eighth inductor and the common inductor. The filter device further includes a tenth inductor that is connected between the second end of the sixth inductor and the second end of the eighth inductor.

In the filter devices according to preferred embodiments of the present disclosure, the paths (second paths) that are connected to the ground terminal without passing through the capacitor are connected with each other by the third path in each of two resonators. Such a configuration makes it possible to increase a coupling degree between the resonators while preventing an increase in a device size.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
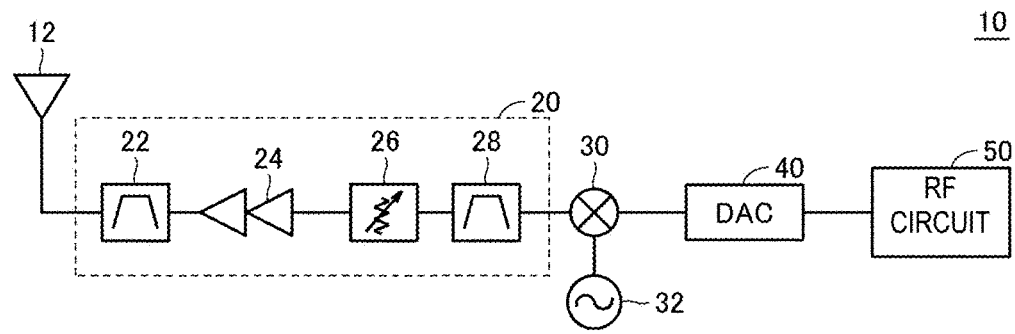
FIG. 1 is a block diagram of a communication device including a high-frequency front-end circuit to which a filter device according to a first preferred embodiment of the present invention is applied.

Preferred embodiments according to the present disclosure will be described in detail below with reference to the accompanying drawings. Note that the same reference characters are given to the same or corresponding portions in the drawings and the description thereof will not be repeated.

First Preferred Embodiment

Basic Configuration of Communication Device

FIG. 1 is a block diagram of a communication device 10 including a high-frequency front-end circuit 20 to which a filter device according to a first preferred embodiment is applied. The communication device 10 is, for example, a mobile terminal typified by a smartphone, or a mobile phone base station.

Referring to FIG. 1, the communication device 10 includes an antenna 12, a high-frequency front-end circuit 20, a mixer 30, a local oscillator 32, a D/A converter (DAC) 40, and an RF circuit 50. Further, the high-frequency front-end circuit 20 includes band pass filters 22 and 28, an amplifier 24, and an attenuator 26. FIG. 1 illustrates a configuration in which the high-frequency front-end circuit 20 includes a transmission circuit to transmit a high-frequency signal from the antenna 12. However, the high-frequency front-end circuit 20 may include a reception circuit to receive a high-frequency signal via the antenna 12.

The communication device 10 up-converts a transmission signal transmitted from the RF circuit 50 into a high-frequency signal and radiates the high-frequency signal from the antenna 12. A modulated digital signal that is a transmission signal outputted from the RF circuit 50 is converted into an analog signal by the D/A converter 40. The mixer 30 up-converts a transmission signal, which is converted from a digital signal into an analog signal by the D/A converter 40, to a high-frequency signal by mixing the transmission signal with an oscillation signal from the local oscillator 32. The band pass filter 28 removes unwanted waves generated in up-conversion, so as to extract only a transmission signal in a desired frequency band. The attenuator 26 adjusts strength of a transmission signal. The amplifier 24 power-amplifies a transmission signal that passes through the attenuator 26 to a predetermined level. The band pass filter 22 removes unwanted waves generated in an amplification process and allows only a signal component in a frequency band, which is specified by the communication standard, to pass therethrough. The transmission signal passing through the band pass filter 22 is radiated from the antenna 12.

A filter device according to a preferred embodiment of the present disclosure can be used as the band pass filters 22 and 28 in the communication device 10 described above.

Configuration of Filter Device

A configuration of a filter device 100 according to the first preferred embodiment will now be described in detail with reference to FIGS. 2 to 4.

Figure 2:
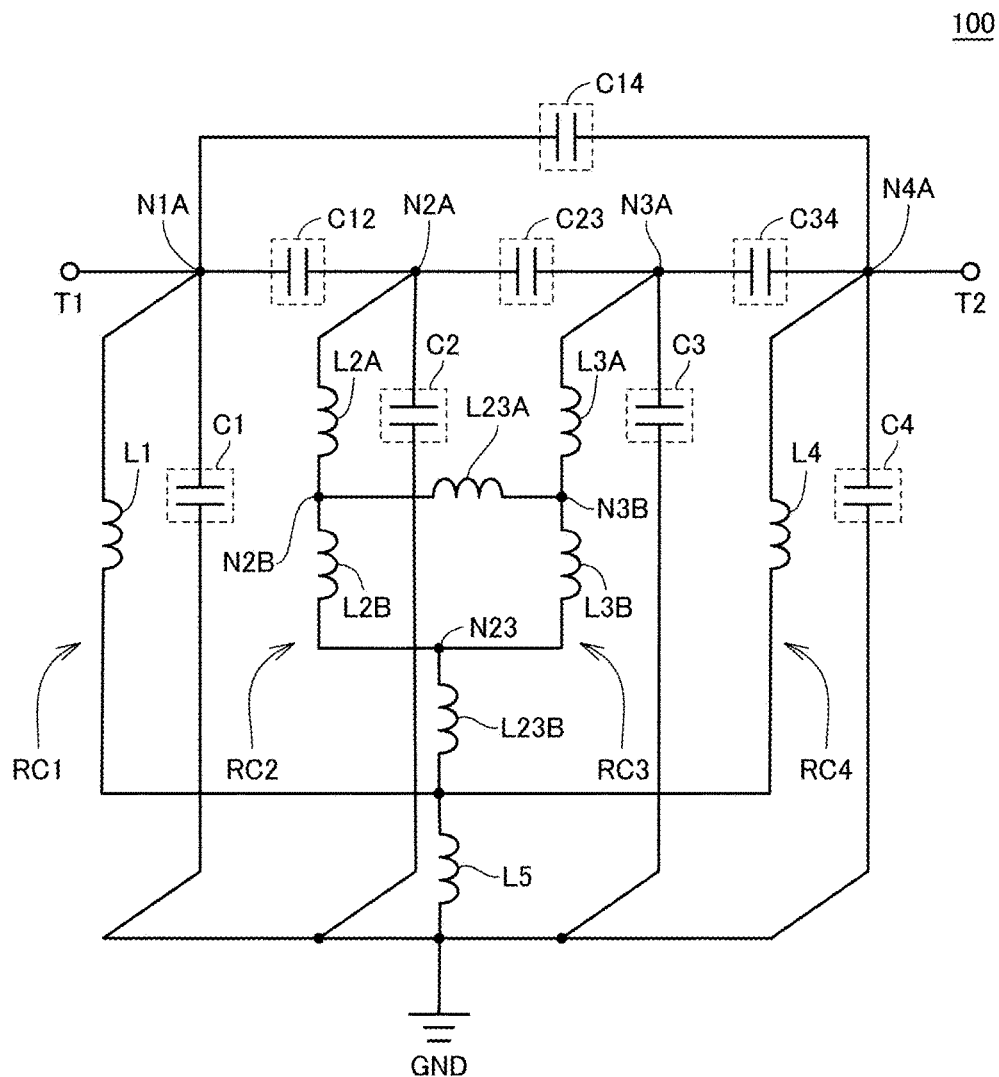
FIG. 2 is an equivalent circuit diagram of the filter device according to the first preferred embodiment of the present invention.

FIG. 2 is an equivalent circuit diagram of the filter device 100. Referring to FIG. 2, the filter device 100 includes an input terminal T1, an output terminal T2, and resonators RC1 to RC4. Each of the resonators RC1 to RC4 is an LC parallel resonator in which an inductor and a capacitor are connected in parallel.

The resonator RC1 includes inductors L1 and L5, which are connected in series between the input terminal T1 and a ground terminal GND, and a capacitor C1, which is connected with the inductors L1 and L5 in parallel. A connection node N1A between the inductor L1 and the capacitor C1 is connected with the input terminal T1.

The resonator RC2 includes inductors L2A, L2B, L23B, and L5, which are connected in series, and a capacitor C2, which is connected with the inductors L2A, L2B, L23B, and L5 in parallel. A connection node N2A between the inductor L2A and the capacitor C2 is connected with the connection node N1A of the resonator RC1 (that is, the input terminal T1) via a capacitor C12.

The resonator RC3 includes inductors L3A, L3B, L23B, and L5, which are connected in series, and a capacitor C3, which is connected with the inductors L3A, L3B, L23B, and L5 in parallel. A connection node N3A between the inductor L3A and the capacitor C3 is connected with a connection node N4A of the resonator RC4 (that is, the output terminal T2) via a capacitor C34. Further, the connection node N3A is also connected with the connection node N2A of the resonator RC2 via a capacitor C23. Furthermore, an inductor L23A is connected between a connection node N3B, which is between the inductor L3A and the inductor L3B, and a connection node N2B, which is between the inductor L2A and the inductor L2B in the resonator RC2.

The resonator RC4 includes inductors L4 and L5, which are connected in series between the output terminal T2 and the ground terminal GND, and a capacitor C4, which is connected with the inductors L4 and L5 in parallel. The connection node N4A for the inductor L4 and the capacitor C4 is connected with the output terminal T2. Further, the connection node N4A is connected with the connection node N1A of the resonator RC1 (that is, the input terminal T1) via a capacitor C14.

As mentioned above, the inductor L5 is shared among the resonators RC1 to RC4. Further, the inductor L23B is shared between the resonators RC2 and RC3.

The resonators are coupled with each other by magnetic coupling. The filter device 100 thus has the configuration in which resonators on four stages which are magnetically coupled with each other are arranged between the input terminal T1 and the output terminal T2. The filter device 100 functions as a band pass filter that allows a signal of a desired frequency band to pass by adjusting a resonant frequency of each resonator.

The connection nodes N2B and N3B in FIG. 2 are examples of a "first node" in the present disclosure. In this case, in the resonator RC2, a path from the connection node N2B via the inductor L2A and the capacitor C2 to the ground terminal GND corresponds to a "first path" in the present disclosure. Further, a path from the connection node N2B via the inductors L2B, L23B, and L5 to the ground terminal GND corresponds to a "second path" in the present disclosure. In a similar manner, in the resonator RC3, a path from the connection node N3B via the inductor L3A and the capacitor C3 to the ground terminal GND corresponds to the "first path" in the present disclosure. Further, a path from the connection node N3B via the inductors L3B, L23B, and L5 to the ground terminal GND corresponds to the "second path" in the present disclosure. The inductor L23A connecting the connection node N2B and the connection node N3B corresponds to a "third path" in the present disclosure.

The capacitor C12 connected with the resonator RC1 and the resonator RC2 may be connected between the connection node N1A and the connection node N2B in FIG. 2. Further, the capacitor C34 connected with the resonator RC3 and the resonator RC4 may be connected between the connection node N3B and the connection node N4A in FIG. 2.

Figure 3:
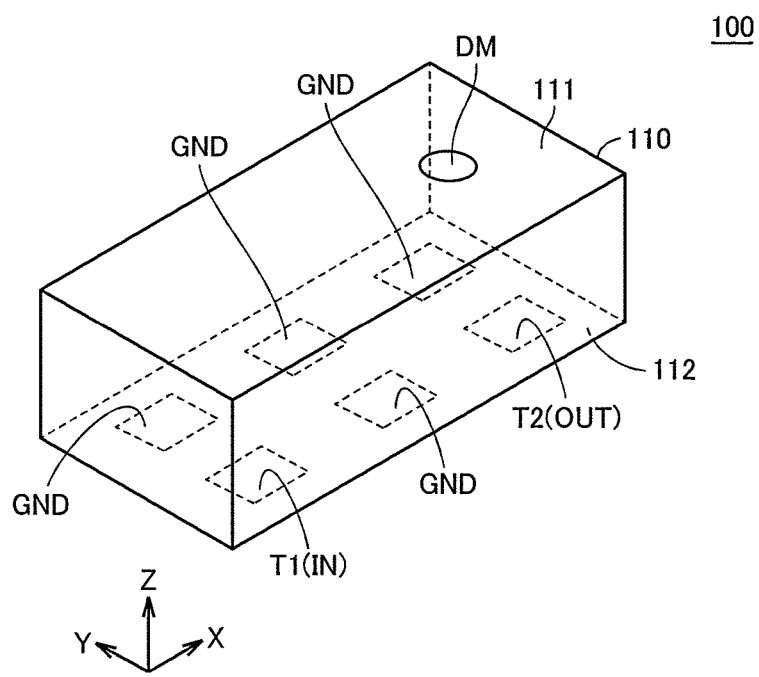
FIG. 3 is an external perspective view of the filter device according to the first preferred embodiment of the present invention.
Figure 4:
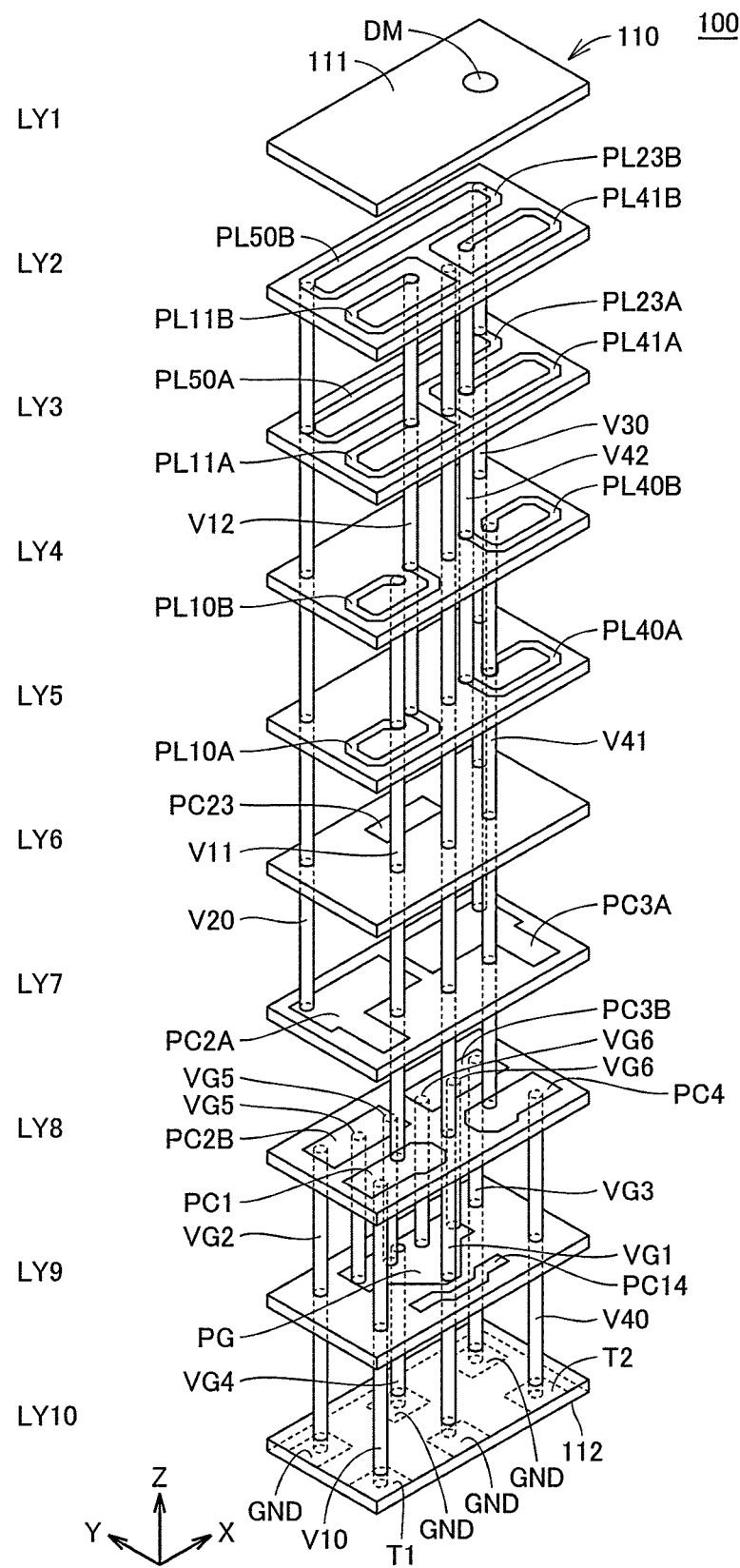
FIG. 4 is an exploded perspective view illustrating an example of a laminated structure of the filter device in FIG. 3.

FIG. 3 is an external perspective view of the filter device 100, and FIG. 4 is an exploded perspective view illustrating an example of a laminated structure of the filter device 100.

Referring to FIG. 3 and FIG. 4, the filter device 100 includes a main body 110 that has a rectangular parallelepiped or substantially rectangular parallelepiped shape and in which a plurality of dielectric layers LY1 to LY10 are laminated in a lamination direction. The dielectric layers LY1 to LY10 are made of, for example, ceramic such as low temperature co-fired ceramics (LTCC) or resin. In the inside of the main body 110, a plurality of electrodes, which are provided on each dielectric layer, and a plurality of vias, which are formed between the dielectric layers, define inductors and capacitors of an LC parallel resonator. Note that, in the present specification, the "via" indicates a conductor that is provided in a dielectric layer so as to connect electrodes which are provided on mutually-different dielectric layers. Vias are formed, for example, by conductive paste, plating, and/or metal pins.

In the following description, the lamination direction of the dielectric layers LY1 to LY10 in the main body 110 is defined as a "Z-axis direction", a direction that is orthogonal to the Z-axis direction and is along the long side of the main body 110 is defined as an "X-axis direction", and a direction that is along the short side of the main body 110 is defined as a "Y-axis direction". Further, a positive direction of the Z axis in each drawing may be referred to as an upper side and a negative direction of the same may be referred to as a lower side, hereinafter.

On an upper surface 111 (the dielectric layer LY1) of the main body 110, a directional mark DM for specifying the direction of the filter device 100 is arranged. On a lower surface 112 (the dielectric layer LY10) of the main body 110, external terminals (the input terminal T1, the output terminal T2, and the ground terminal GND) to connect the filter device 100 with external devices are arranged. The input terminal T1, the output terminal T2, and the ground terminal GND are electrodes each having a plate shape and are land grid array (LGA) terminals which are regularly arranged on the lower surface 112 of the main body 110.

The filter device 100 includes the resonators RC1 to RC4 which are four-stage LC parallel resonators, as described with reference to FIG. 2. More specifically, the resonator RC1 includes vias V10, V11, and V12, a capacitor electrode PC1, and plate electrodes PL10A, PL10B, PL11A, and PL11B. The resonator RC2 includes a via V20, and a capacitor electrode PC2A, and plate electrodes PL23A and PL23B. The resonator RC3 includes a via V30, a capacitor electrode PC3A, and plate electrodes PL23A and PL23B. The resonator RC4 includes vias V40, V41, and V42, a capacitor electrode PC4, and plate electrodes PL40A, PL40B, PL41A, and PL41B.

The input terminal T1 is connected with the capacitor electrode PC1, which is arranged on the dielectric layer LY8, by the via V10. The capacitor electrode PC1 is an electrode that has a substantially rectangular shape and extends in the X-axis direction. The capacitor electrode PC1 is connected with the plate electrode PL10A, which is arranged on the dielectric layer LY5, and the plate electrode PL10B, which is arranged on the dielectric layer LY4, by the via V11.

The plate electrodes PL10A and PL10B are strip-shaped electrodes whose winding axis is the Z-axis direction and have substantially identical shapes to each other. The via V11 is connected to one ends of the plate electrodes PL10A and PL10B. The other ends of the plate electrodes PL10A and PL10B are connected with the plate electrode PL11A, which is arranged on the dielectric layer LY3, and the plate electrode PL11B, which is arranged on the dielectric layer LY2, by the via V12.

The plate electrodes PL11A and PL11B are strip-shaped electrodes whose winding axis is the Z-axis direction and have substantially identical shapes to each other. The via V12 is connected to one ends of the plate electrodes PL11A and PL11B. The other ends of the plate electrodes PL11A and PL11B are connected with a ground electrode PG, which is arranged on the dielectric layer LY9, and the ground terminal GND, which is arranged on the lower surface 112 of the dielectric layer LY10, by a via VG1.

Further, a capacitor electrode PC2B having a substantially rectangular shape is arranged on the dielectric layer LY8 in a manner to be adjacent to the capacitor electrode PC1 in the positive direction of the Y axis. The capacitor electrode PC1 and the capacitor electrode PC2B are capacitively coupled to each other. The capacitor electrode PC2B is connected with the ground terminal GND, which is arranged on the dielectric layer LY10, by a via VG2. The capacitor electrode PC2B is also connected with the ground electrode PG, which is arranged on the dielectric layer LY9, by a plurality of vias VG5. The ground electrode PG is connected with the ground terminal GND, which is arranged on the dielectric layer LY10, by a via VG4.

The vias V10, V11, and V12 and the plate electrodes PL10A, PL10B, PL11A, and PL11B define the inductor L1 in FIG. 2. The via VG1 defines the inductor L5 in FIG. 2. Further, the capacitor electrodes PC1 and PC2B define the capacitor C1 in FIG. 2. That is, the vias V10, V11, V12, and VG1, the plate electrodes PL10A, PL10B, PL11A, and PL11B, and the capacitor electrodes PC1 and PC2B define the resonator RC1.

The capacitor electrode PC1 partially overlaps with the capacitor electrode PC2A, which has a substantially L shape and is arranged on the adjacent dielectric layer LY7, in plan view in the lamination direction. The capacitor electrodes PC1 and PC2A define the capacitor C12 in FIG. 2. The capacitor electrode PC2A partially overlaps also with the capacitor electrode PC2B, which is arranged on the dielectric layer LY8, in plan view in the lamination direction. The capacitor electrodes PC2A and PC2B define the capacitor C2 in FIG. 2.

The capacitor electrode PC2A is connected with the plate electrode PL23A, which is arranged on the dielectric layer LY3, and the plate electrode PL23B, which is arranged on the dielectric layer LY2, by the via V20. Each of the plate electrodes PL23A and PL23B has a substantially Y shape with three end portions, where the via V20 is connected with a first end portion, the via V30 is connected with a second end portion, and the via VG1 is connected with a third end portion.

The via V20 defines the inductor L2A in FIG. 2. The inductor L2B in FIG. 2 includes a path between a connection point of respective paths from the first end portion, second end portion, and third end portion and the first end portion in the plate electrodes PL23A and PL23B. Further, the inductor L23B in FIG. 2 includes a path from the above-mentioned connection point to the third end portion.

That is, the vias V20 and VG1, the plate electrodes PL23A and PL23B, and the capacitor electrodes PC2A and PC2B define the resonator RC2 in FIG. 2.

The via V30, which is connected with the second end portion of the plate electrodes PL23A and PL23B, is connected with the capacitor electrode PC3A, which is arranged on the dielectric layer LY7. The capacitor electrode PC3A has a substantially L shape in a similar manner to the capacitor electrode PC2A. The capacitor electrode PC3A partially overlaps with each of the capacitor electrodes PC3B and PC4, which are arranged on the dielectric layer LY8, in plan view in the lamination direction. Each of the capacitor electrodes PC3B and PC4 is an electrode that has a substantially rectangular shape and extends in the X-axis direction, and the capacitor electrodes PC3B and PC4 are arranged to be adjacent to each other in the Y-axis direction. The capacitor electrode PC3B and the capacitor electrode PC4 are capacitively coupled to each other.

The capacitor electrode PC4 is connected with the output terminal T2, which is arranged on the lower surface 112 of the dielectric layer LY10, by the via V40. The capacitor electrode PC3B is connected with the ground terminal GND, which is arranged on the dielectric layer LY10, by a via VG3. The capacitor electrode PC3B is also connected with the ground electrode PG, which is arranged on the dielectric layer LY9, by a plurality of vias VG6.

The capacitor electrodes PC3A and PC3B define the capacitor C3 in FIG. 2. The capacitor electrodes PC3A and PC4 define the capacitor C34 in FIG. 2. The via V30 defines the inductor L3A in FIG. 2. The inductor L3B includes a path between the connection point and the second end point in the plate electrodes PL23A and PL23B. Further, as mentioned above, the inductor L23B in FIG. 2 includes a path from the connection point to the third end portion in the plate electrodes PL23A and PL23B, the inductor L5 in FIG. 2 includes the via VG1.

That is, the vias V30 and VG1, the plate electrodes PL23A and PL23B, and the capacitor electrodes PC3A and PC3B define the resonator RC3 in FIG. 2.

The capacitor electrode PC4 is connected with the plate electrode PL40A, which is arranged on the dielectric layer LY5, and the plate electrode PL40B, which is arranged on the dielectric layer LY4, by the via V41.

The plate electrodes PL40A and PL40B are strip-shaped electrodes whose winding axis is the Z-axis direction and have substantially identical shapes to each other. The via V41 is connected to one ends of the plate electrodes PL40A and PL40B. The other ends of the plate electrodes PL40A and PL40B are connected with the plate electrode PL41A, which is arranged on the dielectric layer LY3, and the plate electrode PL41B, which is arranged on the dielectric layer LY2, by the via V42.

The plate electrodes PL41A and PL41B are strip-shaped electrodes whose winding axis is the Z-axis direction and have substantially identical shapes to each other. The via V42 is connected to one ends of the plate electrodes PL41A and PL41B. The other ends of the plate electrodes PL41A and PL41B are connected with the ground electrode PG, which is arranged on the dielectric layer LY9, and the ground terminal GND, which is arranged on the lower surface 112 of the dielectric layer LY10, by the via VG1.

The vias V40, V41, and V42 and the plate electrodes PL40A, PL40B, PL41A, and PL41B define the inductor L4 in FIG. 2. The via VG1 defines the inductor L5 in FIG. 2. Further, the capacitor electrodes PC3B and PC4 define the capacitor C4 in FIG. 2. That is, the vias V40, V41, V42, and VG1, the plate electrodes PL40A, PL40B, PL41A, and PL41B, and the capacitor electrodes PC3B and PC4 define the resonator RC4.

Each of the capacitor electrodes PC2A and PC3A, which are arranged on the dielectric layer LY7, partially overlaps with the capacitor electrode PC23, which has a substantially rectangular shape and is arranged on the dielectric layer LY7, in plan view in the lamination direction. The capacitor electrodes PC2A, PC3A, and PC23 define the capacitor C23 in FIG. 2.

Each of the capacitor electrodes PC1 and PC4, which are arranged on the dielectric layer LY8, partially overlaps with the capacitor electrode PC14, which has a strip shape and is arranged on the dielectric layer LY9, in plan view in the lamination direction. The capacitor electrodes PC1, PC4, and PC14 define the capacitor C14 in FIG. 2.

On the dielectric layer LY3, the first terminal and the second terminal of the plate electrode PL23A are connected with each other by a plate electrode PL50A, which has a strip shape and extends in the X-axis direction. Further, on the dielectric layer LY2, the first terminal and the second terminal of the plate electrode PL23B are connected with each other by a plate electrode PL50B, which has a strip shape and extends in the X-axis direction. The plate electrodes PL50A and PL50B define the inductor L23A in FIG. 2.

The plate electrode PL23A and the plate electrode PL50A define an annular structure on the dielectric layer LY3. In a similar manner, the plate electrode PL23B and the plate electrode PL50B define an annular structure on the dielectric layer LY2. As described below, a coupling degree between the resonator RC2 and the resonator RC3 can be strengthened by arranging the inductor L23A, which includes the plate electrodes PL50A and PL50B.

In the following description, the plate electrodes PL50A and PL50B may be referred to inclusively as the "plate electrode PL50" and the plate electrodes PL23A and PL23B may be referred to inclusively as the "plate electrode PL23".

Description of Inter-Resonator Coupling Degree

Figure 5:
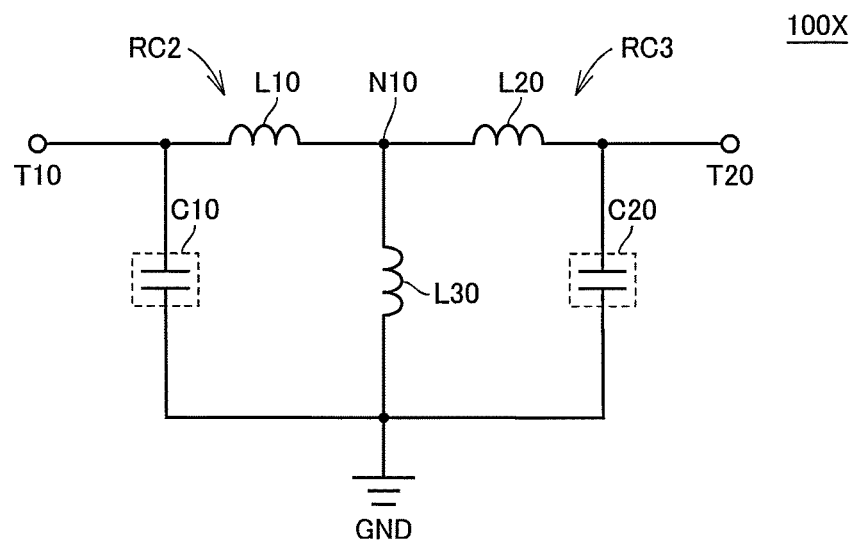
FIG. 5 is a diagram illustrating a first comparative example corresponding to second and third stage filters of the filter device according to the first preferred embodiment of the present invention.

The coupling degree between the resonator RC2 and the resonator RC3 in the filter device 100 according to the present first preferred embodiment will be described with reference to FIGS. 5 and 6. FIG. 5 illustrates a configuration of a filter device 100X according to a first comparative example, and FIG. 6 illustrates the configuration of the filter device 100 according to the present first preferred embodiment.

Figure 6:
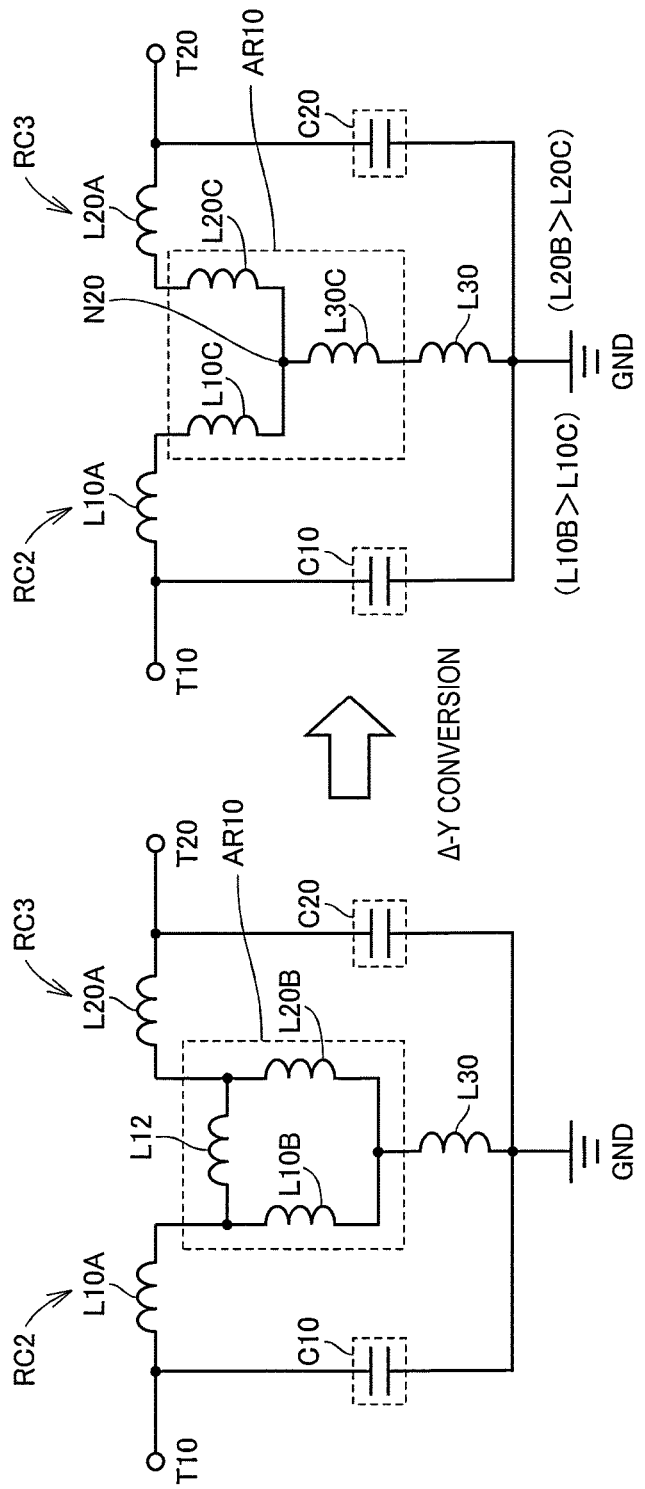
FIG. 6 is a diagram for explaining a coupling degree between the second and third stage filters of the filter device according to the first preferred embodiment of the present invention.

Note that FIGS. 5 and 6 only illustrate equivalent circuits of the configurations corresponding to a portion including the resonator RC2 and the resonator RC3, for ease of explanation. Further, respective portions corresponding to the connection nodes N2A and N3A in FIG. 2 are illustrated as the input terminal T10 and the output terminal T20 in FIGS. 5 and 6.

In FIG. 5, the inductor L10 and the inductor L20 are connected in series between the input terminal T10 and the output terminal T20. Further, the inductor L30 is connected between the connection node N10, which is between the inductor L10 and the inductor L20, and the ground terminal GND. Furthermore, the capacitor C10 is connected between the input terminal T10 and the ground terminal GND, and the capacitor C20 is connected between the output terminal T20 and the ground terminal GND.

In the relation with FIG. 2, the inductor L10 corresponds to the inductors L2A and L2B, and the inductor L20 corresponds to the inductors L3A and L3B. Further, the inductor L30 corresponds to the inductors L23B and L5. The capacitors C10 and C20 correspond to the capacitors C2 and C3 respectively. That is, the filter device 100X has a configuration obtained by removing the "inductor L23A" from the portion including the resonators RC2 and RC3 of FIG. 2.

In FIG. 6, inductors L10A and L10B in the left drawing correspond to the inductors L2A and L2B in FIG. 2 respectively, and the inductors L20A and L20B correspond to the inductors L3A and L3B in FIG. 2 respectively. Further, the inductor L12 corresponds to the inductor L23A in FIG. 2.

In the configuration as that of FIG. 5, the coupling degree between the resonator RC2 and the resonator RC3 can be generally expressed by an inductance value of the inductor L30 with respect to an inductance value of the inductor L10 (L30/L10) or by an inductance value of the inductor L30 with respect to an inductance value of the inductor L20 (L30/L20). Therefore, in FIG. 5, it is conceivable to increase the inductance value of the inductor L30 or decrease the inductance values of the inductors L10 and L20 when the coupling degree between the resonator RC2 and the resonator RC3 is increased.

When the inductance value of the inductor L30 is increased in the configuration as that in FIG. 4, an inductance value of the via VG1 needs to be increased. In other words, the length of the via VG1 needs to be elongated, but this case increases the dimension of the body of the filter device in the Z-axis direction. This may hinder the miniaturization of the device or make it difficult to realize the miniaturization due to dimensional constraints of the device.

On the other hand, when the inductance values of the inductors L10 and L20 are decreased, a total inductance value in the resonators is decreased. Therefore, capacitance values of the capacitors C10 and C20 in the resonators need to be increased so as to realize a desired resonant frequency of the resonators. This requires increase in an area of capacitance electrodes of the capacitors C10 and C20. However, if the area of the capacitance electrodes is increased, an area of the dielectric layer needs to be increased, which may cause increase in size of the device and may make it difficult to achieve a required device dimension. Further, when the inductance value of the resonator is decreased and the capacitance value is increased, impedance of the resonator itself is lowered, which may make it impossible to obtain required filter characteristics.

On the other hand, the configuration of the present first preferred embodiment illustrated in the left drawing of FIG. 6 is a configuration in which $\Delta$-connection (region AR10 of dashed line) including the inductors L10B, L20B, and L12 is arranged between the inductors L10A, L20A, and L30. The region AR10 subjected to $\Delta$-Y conversion is equivalent to the configuration in which the inductor L10C, which is connected with the inductor L10A, the inductor L20C, which is connected with the inductor L20A, and the inductor L30C, which is connected with the inductor L30, are connected at the connection node N20, as illustrated in the right drawing of FIG. 6.

Here, when the $\Delta$-Y conversion is performed, the inductance value of the inductor L10C is lower than the inductance value of the inductor L10B (L10B>L10C), and the inductance value of the inductor L20C is lower than the inductance value of the inductor L20B (L20B>L20C).

When the configuration in the right drawing of FIG. 6 is compared to the configuration of the filter device 100X in FIG. 5, the inductors L10A and L10C correspond to the inductor L10 of the filter device 100X, the inductors L20A and L20C correspond to the inductor L20 of the filter device 100X, and the inductors L30 and L30C correspond to the inductor L30 of the filter device 100X. L10B>L10C, L20B>L20C, and L30C>0 are established, as mentioned above. Therefore, the filter device 100 added with the inductor L12 is equivalent to a configuration obtained by decreasing the inductance values of the inductors L10 and L20 and increasing the inductance value of the inductor L30 in the filter device 100X. Accordingly, the coupling degree between the resonator RC2 and the resonator RC3 in the filter device 100 can be increased more than that in the filter device 100X.

In this case, the increase in the coupling degree can be realized by arranging the plate electrodes PL50A and PL50B as illustrated in FIG. 4, being able to prevent increase in size of the device. Further, impedance reduction can also be prevented by appropriately setting the inductance values of the inductors L10B, L20B, and L12.

Figure 7:
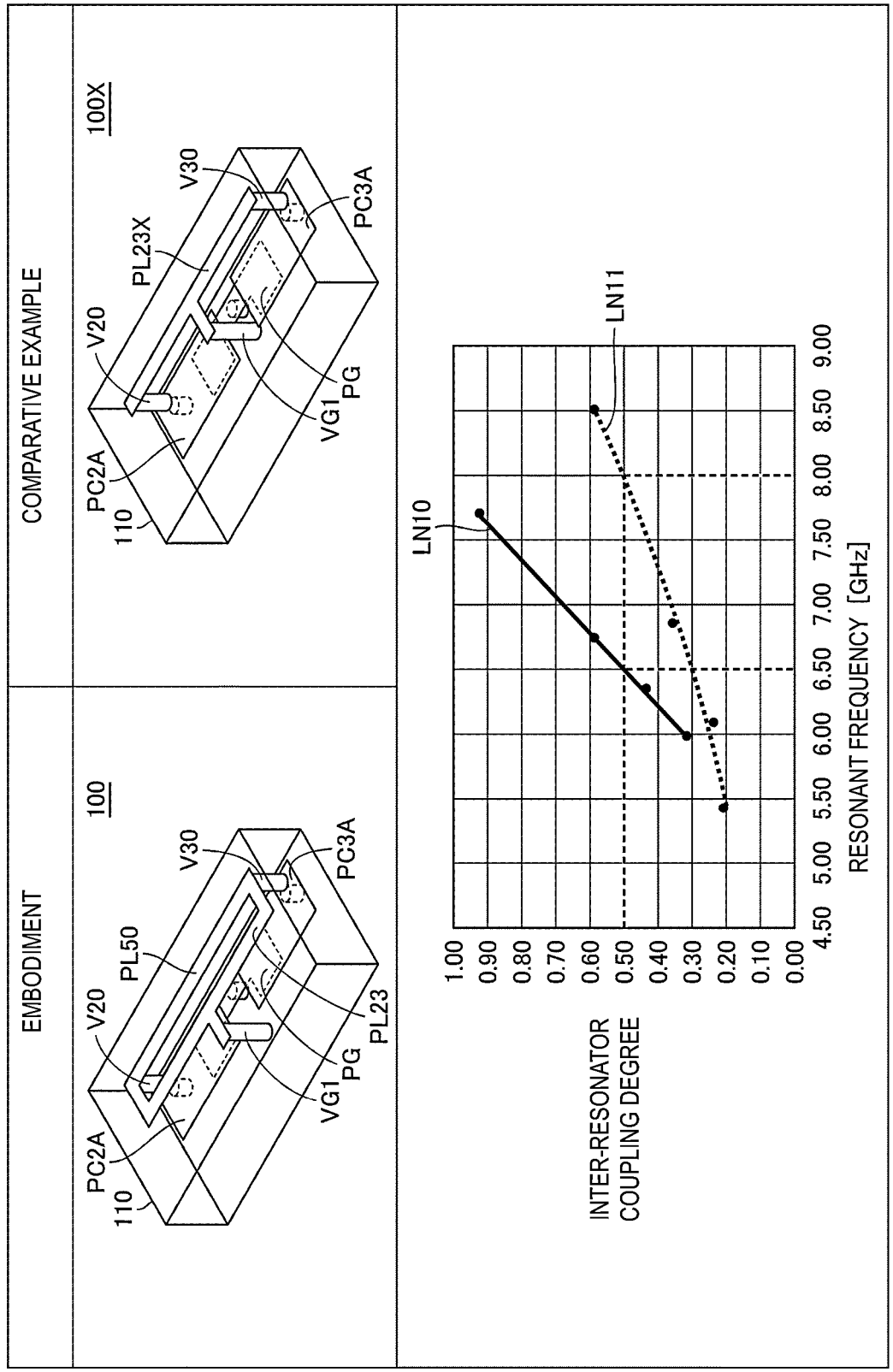
FIG. 7 is a diagram for explaining relations between a resonant frequency and an inter-resonator coupling degree in the filter devices according to the first preferred embodiment of the present invention and the first comparative example.

FIG. 7 is a diagram for explaining relations between a resonant frequency and an inter-resonator coupling degree in the filter devices according to the first preferred embodiment and the first comparative example. The upper portion of FIG. 7 shows internal perspective views of the portions including the resonators RC2 and RC3 in the filter device 100 of the first preferred embodiment and in the filter device 100X of the first comparative example. The lower portion of FIG. 7 illustrates a graph showing relations between a resonant frequency and an inter-resonator coupling degree for the filter devices 100 and 100X having similar device sizes.

The filter device 100 has the annular structure which is defined by the plate electrode PL23, which connects the vias V20, V30, and VG1, and the plate electrode PL50, which connects the vias V20 and V30, on the dielectric layers LY2 and LY3, as described with reference to FIG. 4. On the other hand, in the filter device 100X, the vias V20, V30, and VG1 are connected by a plate electrode PL23X having a substantially T shape.

In the lower portion of FIG. 7, the horizontal axis indicates the resonant frequency, and the vertical axis indicates the inter-resonator coupling degree between the resonators RC2 and RC3. In the graph, a solid line LN10 indicates the case of the filter device 100 according to the first preferred embodiment, and a dashed line LN11 indicates the case of the filter device 100X according to the first comparative example.

As shown in the graph in FIG. 7, when the filter devices 100 and 100X have mutually-similar device sizes, the filter device 100 obtains a higher inter-resonator coupling degree at the same resonant frequency, in resonant frequencies of about 6.0 GHz and higher, for example. For example, when the resonant frequency is about 6.5 GHz, the coupling degree in the filter device 100 is about 0.50 and the coupling degree in the filter device 100X is about 0.30.

On the other hand, in order to obtain the coupling degree of about 0.50 in the filter device 100X, the resonant frequency is required to be higher as about 8.0 GHz, for example. Generally, the higher the resonant frequency, the smaller the required circuit element value, reducing a device size, while the lower the resonant frequency, the larger the required circuit element value, increasing a device size. Therefore, if the configuration of the filter device 100X is used to obtain the coupling degree of about 0.50 when a desired resonant frequency is, for example, about 6.5 GHz, the resulting device size of the filter device 100X is larger than that of the filter device 100. On the other hand, if the configuration of the filter device 100 is used when a desired resonant frequency is about 8.0 GHz, the device size can be further decreased by lowering the circuit element values to increase the resonant frequency because a sufficient coupling degree has already been obtained. In other words, the miniaturization of the overall device can be achieved by using the configuration of the filter device 100 that can achieve an equivalent coupling degree at a lower resonant frequency.

Filter Characteristics

Figure 8:
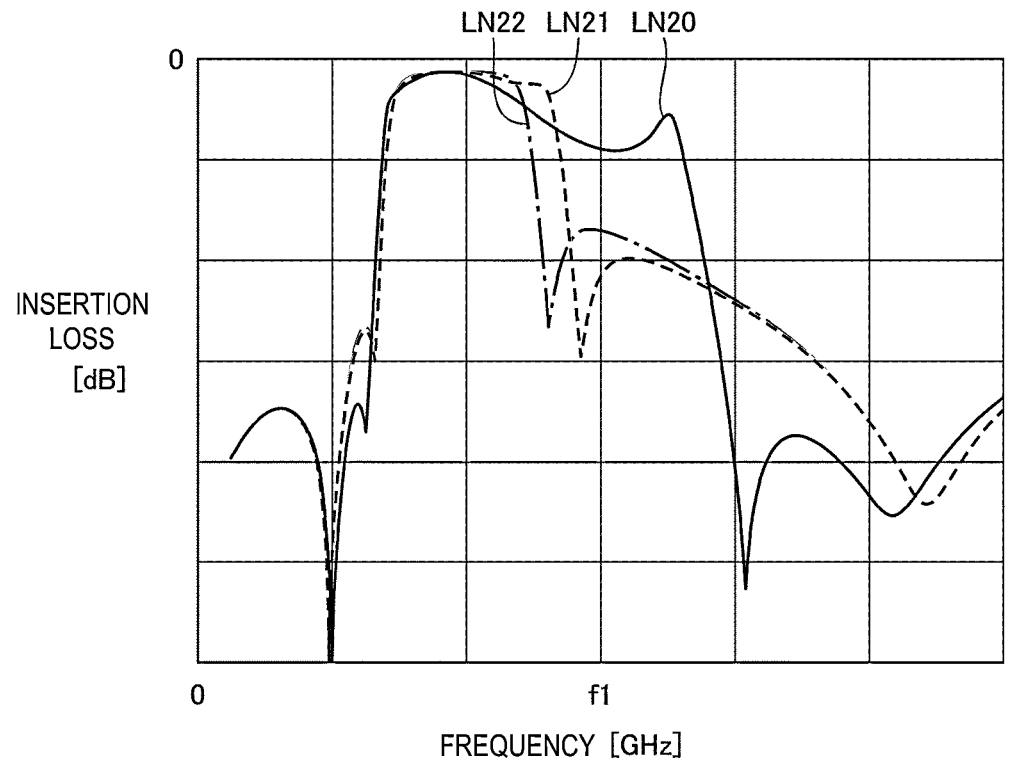
FIG. 8 is a diagram for explaining filter characteristics of the filter device according to the first preferred embodiment of the present invention.

FIG. 8 is a diagram for explaining filter characteristics of the filter device 100 according to the first preferred embodiment. In FIG. 8, the horizontal axis indicates a frequency, and the vertical axis indicates an insertion loss of the filter device 100.

FIG. 8 illustrates change of filter characteristics obtained by changing the length of the plate electrode PL50 in the X-axis direction, in other words, an interval between the vias V20 and V30 of the resonator RC2 and the resonator RC3 respectively. More specifically, a one-dot chain line LN22 in FIG. 8 indicates characteristics obtained when the vias V20 and V30 are at their most distant positions, as shown in FIG. 4, and a dashed line LN21 indicates characteristics obtained when the positions of the vias V20 and V30 are closer along the X-axis direction than those in FIG. 4. Further, a solid line LN20 indicates characteristics obtained when the positions of the vias V20 and V30 are even closer than the positions of the dashed line LN21.

As can be seen from FIG. 8, as the interval between the vias V20 and V30 becomes shorter, in other words, as the coupling degree between the resonator RC2 and the resonator RC3 is strengthened, frequency bandwidth (pass band) of the filter device is increased.

Here, a loss at the high frequency side (around f1) of the pass band is slightly increased in the solid line LN20, but this can be improved by adjusting an inductance value by changing the line width of the plate electrode and/or by adjusting a capacitance value by changing the area of the capacitor electrode.

As described above, the annular structure is included in a laminated filter device, which includes a plurality of stages of resonators, by providing an inductor connecting two resonators. This configuration makes it possible to increase a coupling degree between resonators while preventing increase in the device size. Accordingly, desired characteristics of the filter device can be realized.

The above description has taken the configuration to increase the coupling degree between the second-stage resonator and the third-stage resonator of the filter device including the resonators on four stages, as an example. However, the above-described configuration is applicable to arbitrary two resonators of the resonators on four stages.

The "resonator RC2" and the "resonator RC3" in the first preferred embodiment correspond to a "first resonator" and a "second resonator" respectively in the present disclosure. Further, the "resonator RC1" and the "resonator RC4" in the first preferred embodiment correspond to a "third resonator" and a "fourth resonator" respectively in the present disclosure. The "via VG1" in the first preferred embodiment corresponds to a "common via" in the present disclosure. The "capacitor electrode PC2A" and the "capacitor electrode PC3A" in the first preferred embodiment correspond to a "first capacitor electrode" and a "second capacitor electrode" respectively in the present disclosure. The "via V20" and the "via V30" in the first preferred embodiment correspond to a "first via" and a "second via" respectively in the present disclosure. The "plate electrodes PL23A and PL23B" in the first preferred embodiment correspond to a "first plate electrode" and a "second plate electrode" in the present disclosure. The "plate electrodes PL50A and PL50B" in the first preferred embodiment correspond to a "third plate electrode" in the present disclosure.

The "capacitor C2" and the "capacitor C3" in the first preferred embodiment in the equivalent circuit diagram of FIG. 2 correspond to a "first capacitor" and a "second capacitor" respectively in the present disclosure. The "inductor L2A", the "inductor L2B", the "inductor L3A", the "inductor L3B", and the "inductor L23A" in the first preferred embodiment correspond to a "first inductor" to a "fifth inductor" respectively in the present disclosure. The "inductor L23B" and the "inductor L5" in the first preferred embodiment correspond to a "common inductor" in the present disclosure.

Modification

A configuration of a filter device according to a modification of the first preferred embodiment will now be described with reference to FIGS. 9 to 12. FIGS. 9 to 12 are schematic drawings schematically showing only a portion including the resonators RC2 and RC3 in FIG. 2.

Figure 9:
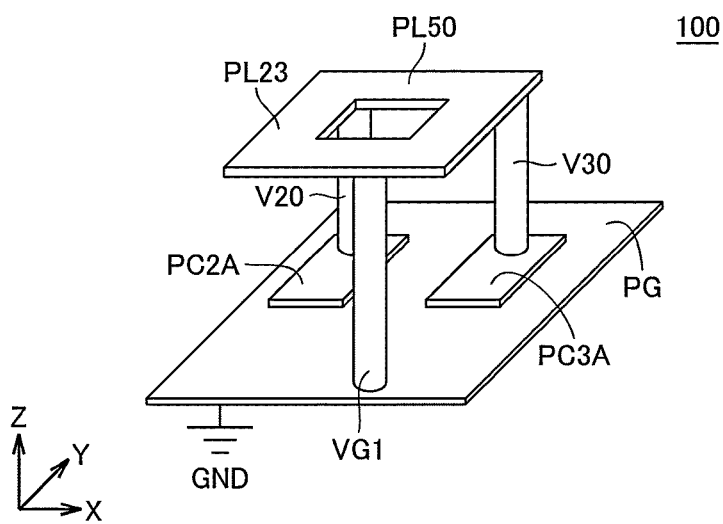
FIG. 9 is a schematic diagram of the second and third stage filters of the filter device according to the first preferred embodiment of the present invention.

FIG. 9 is a diagram corresponding to the filter device 100 of FIG. 4 and illustrates a portion including the annular structure included in the dielectric layers LY2 and LY3 of FIG. 4. The illustration of the capacitor electrodes PC2B and PC3B opposed to the capacitor electrodes PC2A and PC3A is omitted, and the capacitor electrodes PC2A and PC3A are illustrated to be opposed to the ground electrode PG. In the filter device 100, the plate electrode PL50 and the plate electrode PL23 defining the annular structure include wiring patterns arranged on the same dielectric layer.

First Modification

A first modification will describe an example in which a portion forming the annular structure includes wiring patterns, which are arranged on different dielectric layers, and vias, which connect the wiring patterns.

Figure 10:
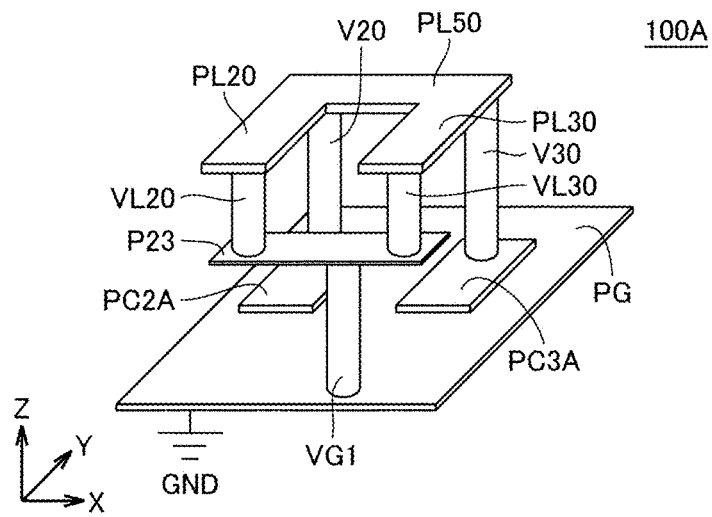
FIG. 10 is a schematic diagram of second and third stage filters of a filter device according to a first modification of a preferred embodiment of the present invention.

FIG. 10 is a drawing illustrating a filter device 100A according to the first modification. In the filter device 100A, a portion corresponding to the plate electrode PL23 in the filter device 100 of FIG. 9 includes plate electrodes PL20, PL30, and P23 and vias VL20 and VL30.

The plate electrode PL20 is a substantially-rectangular strip-shaped electrode and extends in the negative direction of the Y axis from an end portion, to which the via V20 is connected, in the plate electrode PL50. In a similar manner, the plate electrode PL30 is a substantially-rectangular strip-shaped electrode and extends in the negative direction of the Y axis from another end portion, to which the via V30 is connected, in the plate electrode PL50.

The plate electrode P23 is arranged on a dielectric layer between a dielectric layer, on which the plate electrodes PL20 and PL30 are arranged, and a dielectric layer, on which the ground electrode PG is arranged. The plate electrode P23 is a substantially-rectangular strip-shaped electrode that extends in the X-axis direction, and one end thereof is connected with an end portion of the plate electrode PL20 in the negative direction of the Y axis, by the via VL20. The other end of the plate electrode P23 is connected with an end portion of the plate electrode PL30 in the negative direction of the Y axis, by the via VL30. The plate electrode P23 is connected with the ground electrode PG by the via VG1.

In the filter device 100A, the inductor, which defines the resonator RC2, includes the vias V20 and VL20 and the plate electrodes PL20 and P23, and the inductor, which defines the resonator RC3, includes the vias V30 and VL30 and the plate electrodes PL30 and P23. The resonator RC2 and the resonator RC3 are connected with each other by the plate electrode PL50, which corresponds to the inductor L23A in FIG. 2. That is, the plate electrode P23, which is arranged on the different dielectric layer from that of the plate electrodes PL20, PL30, and PL50, is connected by using the vias VL20 and VL30, defining an annular structure over a plurality of layers.

The annular structure is thus provided also in the filter device 100A by arranging the inductors connecting the resonator RC2 and the resonator RC3, being able to increase the coupling degree between the resonator RC2 and the resonator RC3.

The "via VG1" in the first modification corresponds to the "common via" in the present disclosure. The "plate electrode P23" in the first modification corresponds to a "common electrode" in the present disclosure. The "via V20", the "via VL20", the "via V30", and the "via VL30" in the first modification correspond to a "third via", a "fourth via", a "fifth via", and a "sixth via" respectively in the present disclosure. The "capacitor electrode PC2A] and the "capacitor electrode PC3A] in the first modification correspond to a "third capacitor electrode" and a "fourth capacitor electrode" respectively in the present disclosure. The "plate electrode PL20", the "plate electrode PL30", and the "plate electrode PL50" in the first modification correspond to a "fourth plate electrode", a "fifth plate electrode", and a "sixth plate electrode" respectively in the present disclosure.

Second Modification

In regard to the filter device 100 of FIG. 9, the example has been described in which both of the ground electrode, which defines a capacitor in each resonator, and the ground electrode, to which an inductor of each resonator is connected, include the ground electrode PG, which is arranged on the lower surface 112 side of the main body 110.

In a second modification, a configuration will be described in which ground electrodes are arranged on the upper surface 111 side and the lower surface 112 side of the main body 110, one ground electrode defines a capacitor of a resonator, and an inductor of each resonator is connected to the other ground electrode.

Figure 11:
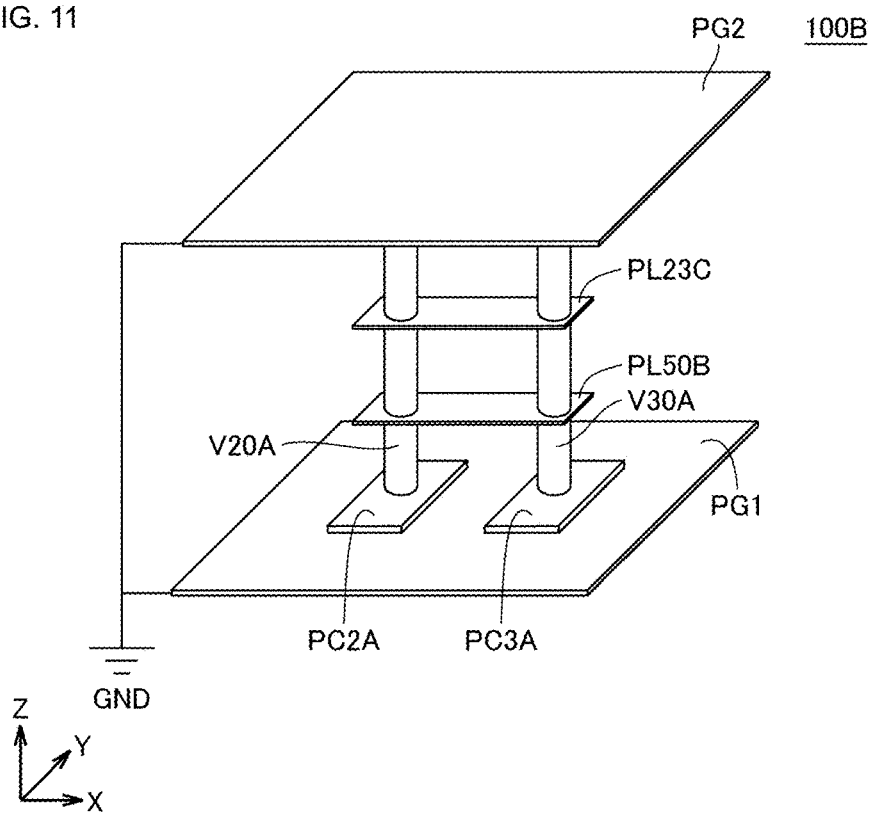
FIG. 11 is a schematic diagram of second and third stage filters of a filter device according to a second modification of a preferred embodiment of the present invention.

FIG. 11 is a drawing illustrating a filter device 100B according to the second modification. In the filter device 100B, a ground electrode PG1 is arranged on the lower surface 112 side of the main body 110 and a ground electrode PG2 is arranged on the upper surface 111 side. The ground electrode PG1 and the ground electrode PG2 are connected with each other by a via, which is not shown, and are connected to the ground terminal GND.

The capacitor electrode PC2A, which defines the capacitor C2 of the resonator RC2, and the capacitor electrode PC3A, which defines the capacitor C3 of the resonator RC3, are arranged to be opposed to the ground electrode PG1. The capacitor electrode PC2A is connected to the ground electrode PG2 by the via V20A. The capacitor electrode PC3A is connected to the ground electrode PG2 by the via V30A.

The via V20A and the via V30A are connected with each other by a plate electrode PL23C having a substantially rectangular shape. The via V20A and the via V30A are also connected with each other by a plate electrode PL50B that is arranged on a dielectric layer between a dielectric layer, on which the plate electrode PL23C is arranged, and a dielectric layer, on which the capacitor electrodes PC2A and PC3A are arranged.

In the filter device 100B, a portion between the capacitor electrode PC2A and the plate electrode PL50B in the via V20A corresponds to the via V20 in the filter device 100 of FIG. 9. Further, a portion between the capacitor electrode PC3A and the plate electrode PL50B in the via V30A corresponds to the via V30 in the filter device 100 of FIG. 9. Further, a portion including portions between the plate electrode PL50B and the plate electrode PL23C in the vias V20A and V30A and the plate electrode PL23C corresponds to the plate electrode PL23 in the filter device 100 of FIG. 9. Further, portions between the plate electrode PL23C and the ground electrode PG2 in the vias V20A and V30A correspond to the via VG1 in the filter device 100 of FIG. 9. The plate electrode PL50B corresponds to the plate electrode PL50 in the filter device 100 of FIG. 9. In other words, the filter device 100B has a substantially equivalent configuration to the filter device 100 illustrated in FIG. 9, and an annular structure is defined by the vias V20A and V20B and the plate electrodes PL23C and PL50B.

The two resonators RC2 and RC3 are thus arranged between two ground electrodes and these resonators RC2 and RC3 are connected with each other by the inductor (plate electrode PL50B), being able to increase the coupling degree between the resonator RC2 and the resonator RC3.

Here, the portion including the vias connecting the plate electrode PL23C and the ground electrode PG2 may be shared in the filter device 100B.

Third Modification

A third modification will describe a configuration in which a capacitor of a resonator is defined by a capacitance component between a wiring pattern defining an annular structure and a ground electrode, without separately providing a capacitor electrode that defines a capacitor of a resonator.

Figure 12:
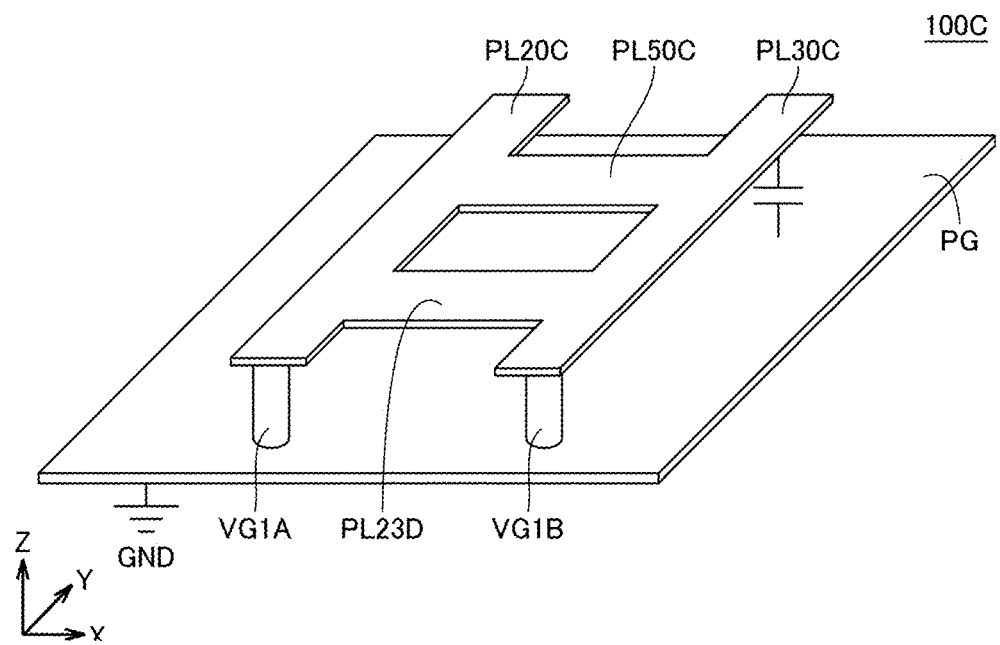
FIG. 12 is a schematic diagram of second and third stage filters of a filter device according to a third modification of a preferred embodiment of the present invention.

FIG. 12 is a drawing illustrating a filter device 100C according to the third modification. In the filter device 100C, the resonators RC2 and RC3 include plate electrodes PL20C, PL30C, PL23D, and PL50C, which are arranged on the same dielectric layer, and vias VG1A and VG1B.

Each of the plate electrodes PL20C and PL30C is a substantially-rectangular strip-shaped electrode that extends in the Y-axis direction. An end portion of the plate electrode PL20C in the negative direction of the Y axis is connected with the ground electrode PG by the via VG1A, and another end portion in the positive direction of the Y axis is an open end. In a similar manner, an end portion of the plate electrode PL30C in the negative direction of the Y axis is connected with the ground electrode PG by a via VG2A, and another end portion in the positive direction of the Y axis is an open end.

The plate electrodes PL23D and PL50C are substantially-rectangular strip-shaped electrodes that extend in the X-axis direction. The plate electrodes PL20C and PL30C are connected with each other by the plate electrode PL23D at positions close to the end portions thereof in the negative direction of the Y axis. Further, the plate electrodes PL20C and PL30C are connected with each other by the plate electrode PL50C at positions in the further positive direction of the Y axis than the plate electrode PL23D. That is, the plate electrodes PL20C, PL30C, PL23D, and PL50C define an annular structure.

In the filter device 100C, a capacitor of a resonator includes a capacitance component between the ground electrode PG and the plate electrodes PL20C and PL30C, and the resonators RC2 and RC3 include an inductor including the capacitance component and the plate electrode.

In such a configuration as well, the two resonators RC2 and RC3 are connected by the inductor to define the annular structure, being able to increase the coupling degree between the resonator RC2 and the resonator RC3.

Here, a via to connect the plate electrode PL23D and the ground electrode PG may be arranged instead of the vias VG1A and VG1B in the filter device 100C. Further, in order to ensure a capacitance value between the ground electrode PG and the plate electrodes PL20C and PL30C, a wider capacitor electrode than the plate electrodes PL20C and PL30C may be provided at the open ends of the plate electrodes PL20C and PL30C.

Second Preferred Embodiment

A second preferred embodiment will describe a filter device in which some of resonators have a different configuration.

Figure 13:
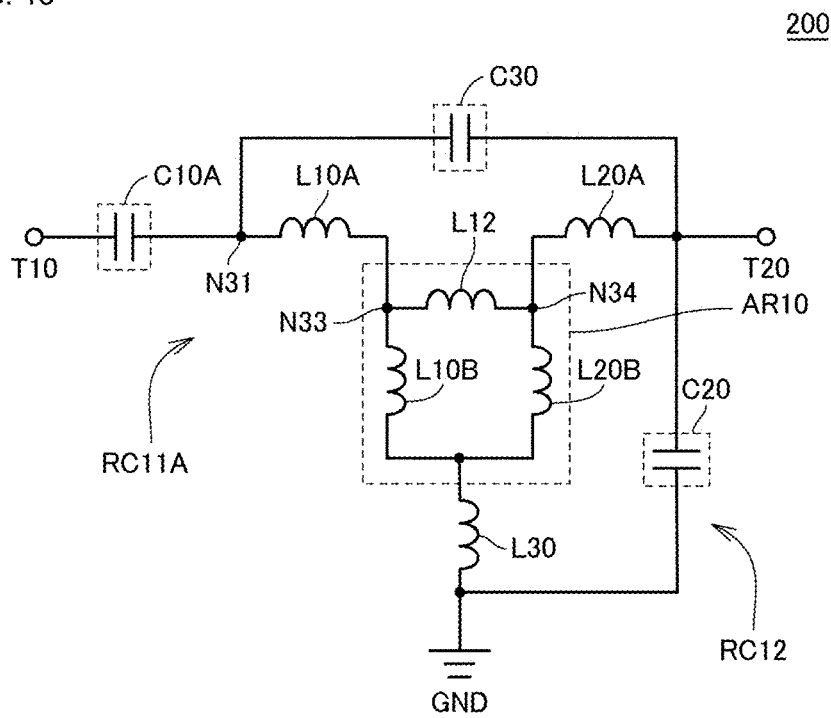
FIG. 13 is an equivalent circuit diagram of a filter device according to a second preferred embodiment of the present invention.

FIG. 13 is an equivalent circuit diagram of a filter device 200 according to the second preferred embodiment. The filter device 200 is roughly a two-stage filter device in which two resonators RC11A and RC12 are arranged between the input terminal T10 and the output terminal T20. The filter device 200 may be singularly used in a two-stage state as that in FIG. 13 or may be used as resonators on the second-third stages in a four-stage filter device as that in the first preferred embodiment. To make the correspondence with the first preferred embodiment easier to understand, the same reference characters as those of the circuit in FIG. 6 are used in FIG. 13 and in FIGS. 14 and 17 described later.

Referring to FIG. 13, the resonator RC11A includes a capacitor C10A and the inductors L10A, L10B, and L30, in the filter device 200. One end of the capacitor C10A is connected to the input terminal T10. The inductors L10A, L10B, and L30 are connected in series in this order between the other end of the capacitor C10A and the ground terminal GND.

The resonator RC12 has a similar configuration to that of the resonator RC3 in FIG. 6 and includes the capacitor C20 and the inductors L20A, L20B, and L30. The capacitor C20 is connected between the output terminal T20 and the ground terminal GND. The inductors L20A, L20B, and L30 are connected in series in this order between the output terminal T20 and the ground terminal GND. That is, the inductors L20A, L20B, and L30, which are connected in series, are connected in parallel to the capacitor C20 between the output terminal T20 and the ground terminal GND. The inductor L30 is shared with the resonator RC11A.

Further, a capacitor C30 is connected between a connection node N31, which is between the capacitor C10A and the inductor L10A, and the output terminal T20. Furthermore, the inductor L12 is connected between a connection node N33, which is between the inductor L10A and the inductor L10B, and a connection node N34, which is between the inductor L20A and the inductor L20B. An annular structure (region AR10) is defined by the inductors L12, L10B, and L20B as is the case with the filter device 100 of the first preferred embodiment. Here, the capacitor C30 is not necessarily required in the filter device 200 and the configuration without the capacitor C30 may be used.

Figure 14:
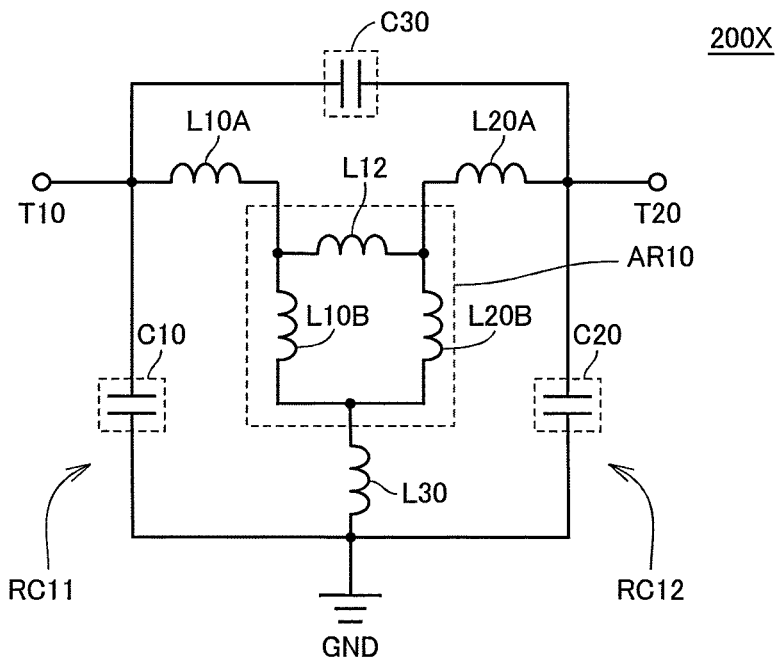
FIG. 14 is an equivalent circuit diagram of a filter device according to a second comparative example.

FIG. 14 is an equivalent circuit diagram of a filter device 200X according to a second comparative example. The filter device 200X basically has a similar configuration to the resonators on the second-third stages of the filter device 100 according to the first preferred embodiment. The resonators RC11 and RC12 in the filter device 200X correspond to RC2 and RC3 of the filter device 100 respectively. Further, the capacitor C30 in the filter device 200X corresponds to the capacitor C23 (FIG. 1) in the filter device 100.

That is, compared to the filter device 200X of the second comparative example, the filter device 200 of the second preferred embodiment has a configuration in which the capacitor C10 is removed and the capacitor C10A is added between the input terminal T10 and the inductor L10A.

Figure 15:
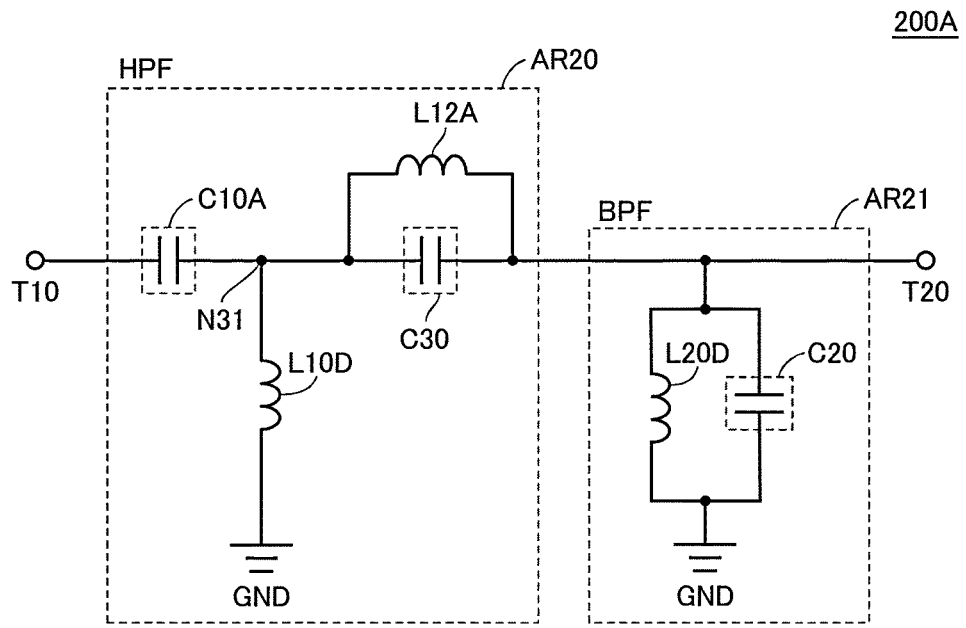
FIG. 15 is a diagram obtained by converting an equivalent circuit of FIG. 14.

FIG. 15 is a circuit diagram obtained by performing equivalent conversion with respect to the circuit of FIG. 14. An inductor L10D in FIG. 15 corresponds to the inductors L10A, L10B, and L30 in FIG. 14. An inductor L12A in FIG. 15 corresponds to the inductors L10A, L12, and L20A in FIG. 14. An inductor L20D in FIG. 15 corresponds to the inductors L20A, L20B, and L30 in FIG. 14.

That is, the filter device 200 corresponds to the configuration in which a high pass filter (HPF) and a band pass filter (BPF) are connected in series between the input terminal T10 and the output terminal T20. The high pass filter includes the capacitors C10A and C30 and the inductors L10D and L12A which are included in the region AR20 of FIG. 15. The band pass filter includes an LC parallel resonator of the capacitor C20 and the inductor L20D which are included in the region AR21.

On the other hand, the filter device 200X of the second comparative example corresponds to the configuration in which two LC parallel resonators (that is, band pass filters) are connected in series between the input terminal T10 and the output terminal T20.

Figure 16:
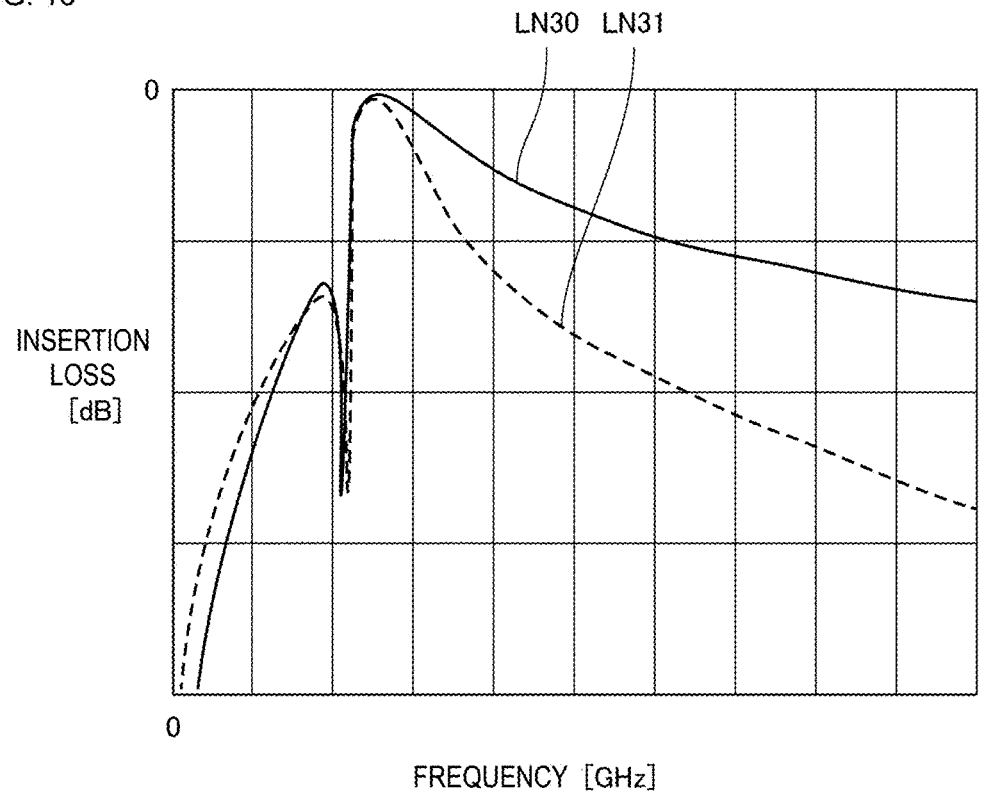
FIG. 16 is a diagram for explaining filter characteristics of the filter device according to the second preferred embodiment of the present invention.

FIG. 16 is a diagram for explaining filter characteristics of the filter device 200 according to the second preferred embodiment. FIG. 16 shows an insertion loss (solid line LN30) in the filter device 200 and an insertion loss (dashed line LN35) in the filter device 200X of the second comparative example.

The filter device 200 has the configuration obtained by replacing the band pass filter on the input terminal side of the filter device 200X of the second comparative example with the high pass filter. Therefore, an attenuation at the lower frequency side of the pass band is slightly smaller in the filter device 200 than in the filter device 200X. However, a shunt capacitor is removed and therefore, the loss is reduced on the high frequency side and the bandpass characteristics are improved compared to the filter device 200X. Further, the annular structure is also included in the filter device 200 by providing the inductor L12 connecting two resonators, being able to increase the coupling degree between the resonators while preventing an increase in the device size.

The "resonator RC11A" and the "resonator RC12" in the second preferred embodiment correspond to a "fifth resonator" and a "sixth resonator" respectively in the present disclosure. The "capacitor C10A", the "capacitor C20", and the "capacitor C30" in the second preferred embodiment correspond to a "third capacitor" to a "fifth capacitor" respectively in the present disclosure. The "inductor L10A", the "inductor L10B", the "inductor L20A", the "inductor L20B", and the "inductor L12" in the second preferred embodiment correspond to a "sixth inductor" to a "tenth inductor" respectively in the present disclosure. The "inductor L30" in the second preferred embodiment corresponds to a "common inductor" in the present disclosure. The "connection node N31" in the second preferred embodiment corresponds to a "third node" in the present disclosure.

Third Preferred Embodiment

A third preferred embodiment will describe a configuration in which the resonator RC12 in the filter device 200 of the second preferred embodiment is further replaced with a high pass filter.

Figure 17:
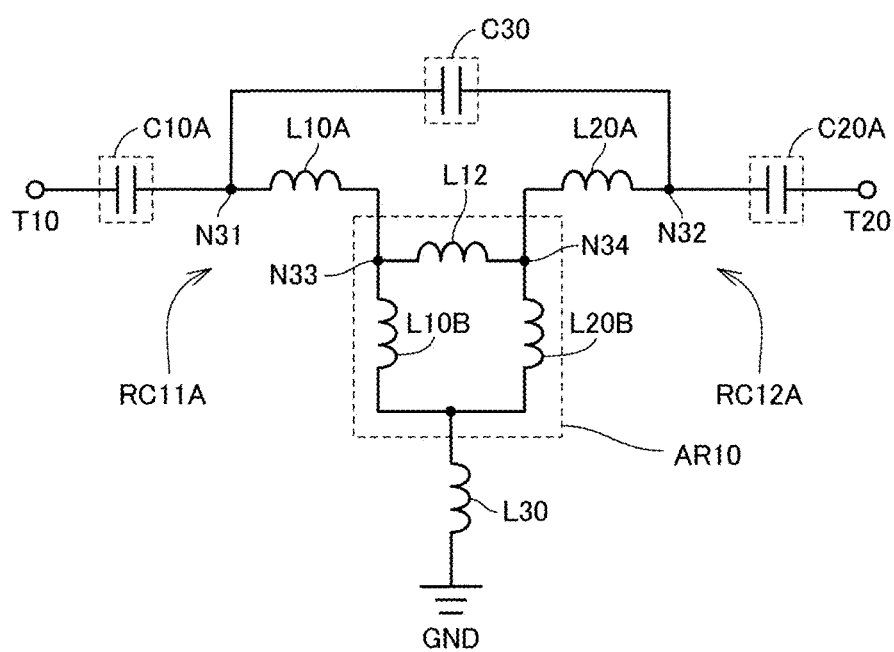
FIG. 17 is an equivalent circuit diagram of a filter device according to a third preferred embodiment of the present invention.

FIG. 17 is an equivalent circuit diagram of a filter device 200A according to the third preferred embodiment. The filter device 200A has a configuration obtained by replacing the resonator RC12 of the filter device 200 of the second preferred embodiment with a resonator RC12A.

More specifically, the capacitor C20 in the filter device 200 is removed and a capacitor C20A is added between the inductor L20A and the output terminal T20. Further, the capacitor C30 is connected between the connection node N31, which is between the capacitor C10A and the inductor L10A, and a connection node N32, which is between the capacitor C20A and the inductor L20A. That is, although not shown, the configuration of the filter device 200A corresponds to the configuration in which two high pass filters are arranged between the input terminal T10 and the output terminal T20 when equivalent conversion is performed with respect to the circuit of FIG. 17 as FIG. 15. Therefore, the attenuation in the filter device 200A is slightly lower than that in the filter device 200, but efficiency of the filter device 200A is further improved.

Further, the annular structure is also included in the filter device 200A by the inductor L12, to which two resonators are connected, as illustrated in the region AR10, being able to increase the coupling degree between the resonators while preventing increase in the device size.

The "resonator RC12A" in the third preferred embodiment corresponds to a "seventh resonator" in the present disclosure. The "capacitor C20A" in the third preferred embodiment corresponds to a "sixth capacitor" in the present disclosure. The "connection node N32" in the third preferred embodiment corresponds to a "fourth node" in the present disclosure.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
 a main body;
 an input terminal;
 an output terminal;
 a ground terminal;
 a ground electrode that is connected with the ground terminal; and
 a common via that is connected with the ground electrode;
 a first resonator and a second resonator that are located in the main body and are electro-magnetically coupled with each other so as to transmit a signal from the input terminal to the output terminal; wherein
 each of the first resonator and the second resonator includes:
  a first path that is connected from a first node via a capacitor to the ground terminal; and
  a second path that is connected from the first node to the ground terminal without passing through a capacitor;
 the second path of the first resonator and the second path of the second resonator are partially shared;
 the filter device further includes a third path that is connected with the first node of the first resonator and the first node of the second resonator;
 the first resonator includes:
  a first capacitor electrode opposed to the ground electrode;
  a first via that is connected with the first capacitor electrode; and
  a first plate electrode that is connected with the first via and the common via;
 the second resonator includes:
  a second capacitor electrode opposed to the ground electrode;
  a second via that is connected with the second capacitor electrode; and
  a second plate electrode that is connected with the second via and the common via; and
 the filter device further includes a third plate electrode that is connected with the first via and the second via.

2. The filter device according to claim 1, wherein
 the first path of the first resonator includes the first capacitor electrode and the first via;

the second path of the first resonator includes the first plate electrode and the common via;
the first path of the second resonator includes the second capacitor electrode and the second via;
the second path of the second resonator includes the second plate electrode and the common via; and
the third path includes the third plate electrode.

3. A filter device comprising:
a main body including a plurality of dielectric layers that are laminated;
an input terminal;
an output terminal;
a ground terminal;
a ground electrode that is connected with the ground terminal;
a common electrode that is located on a different dielectric layer from that of the ground electrode; and
a common via that is connected with the ground electrode and the common electrode;
a first resonator and a second resonator that are located in the main body and are electro-magnetically coupled with each other so as to transmit a signal from the input terminal to the output terminal; wherein
each of the first resonator and the second resonator includes:
a first path that is connected from a first node via a capacitor to the ground terminal; and
a second path that is connected from the first node to the ground terminal without passing through a capacitor;
the second path of the first resonator and the second path of the second resonator are partially shared;
the filter device further includes a third path that is connected with the first node of the first resonator and the first node of the second resonator;
the first resonator includes:
a third capacitor electrode that is opposed to the ground electrode;
a third via that is connected with the third capacitor electrode; and
a fourth plate electrode that is connected with the third via and the fourth via;
the second resonator includes:
a fourth capacitor electrode that is opposed to the ground electrode;
a fifth via that is connected with the fourth capacitor electrode;
a sixth via that is connected with the common electrode; and
a fifth plate electrode that is connected with the fifth via and the sixth via; and
the filter device further includes a sixth plate electrode that connects the third via and the fifth via with each other.

4. The filter device according to claim 3, wherein
the first path of the first resonator includes the third capacitor electrode and the third via;
the second path of the first resonator includes the fourth plate electrode, the third via, the fourth via, the common electrode, and the common via;
the first path of the second resonator includes the fourth capacitor electrode and the fifth via;
the second path of the second resonator includes the fifth plate electrode, the fifth via, the sixth via, the common electrode, and the common via; and
the third path includes the sixth plate electrode.

5. The filter device according to claim 1, further comprising:
a third resonator that is connected with the input terminal and is electro-magnetically coupled with the first resonator; and
a fourth resonator that is connected with the output terminal and is electro-magnetically coupled with the second resonator.

6. A filter device comprising:
an input terminal;
an output terminal;
a ground terminal; and
a first resonator and a second resonator that are electro-magnetically coupled with each other so as to transmit a signal from the input terminal to the output terminal; wherein
the first resonator includes:
a first capacitor that is connected between a first node and the ground terminal;
a first inductor including a first end that is connected to the first node;
a second inductor that is connected with a second end of the first inductor; and
a common inductor that is connected between the second end of the second inductor and the ground terminal;
the second resonator includes:
a second capacitor that is connected between a second node and the ground terminal;
a third inductor including a first end that is connected to the second node; and
a fourth inductor that is connected between a second end of the third inductor and the common inductor; and
the filter device further includes a fifth inductor that is connected between the second end of the first inductor and the second end of the third inductor.

7. The filter device according to claim 1, wherein the filter device is a band pass filter to allow a signal of a specific frequency band to pass therethrough.

8. A filter device comprising:
a main body;
an input terminal;
an output terminal;
a ground terminal; and
a fifth resonator and a sixth resonator that are located in the main body and are electro-magnetically coupled with each other so as to transmit a signal from the input terminal to the output terminal; wherein
the fifth resonator includes:
a third capacitor that is connected between a third node and the input terminal;
a sixth inductor including a first end that is connected to the third node;
a seventh inductor that is connected with a second end of the sixth inductor; and
a common inductor that is connected between the second end of the seventh inductor and the ground terminal;
the sixth resonator includes:
a fourth capacitor that is connected between the output terminal and the ground terminal;
an eighth inductor including a first end that is connected to the output terminal; and
a ninth inductor that is connected between a second end of the eighth inductor and the common inductor; and the filter device further includes a tenth inductor that is connected between the second end of the sixth inductor and the second end of the eighth inductor.

9. The filter device according to claim 8, further comprising:
a fifth capacitor that is connected with the fifth resonator and the sixth resonator.

10. A filter device comprising:
a main body;
an input terminal;
an output terminal;
a ground terminal; and
a fifth resonator and a seventh resonator that are located in the main body and are electro-magnetically coupled with each other so as to transmit a signal from the input terminal to the output terminal; wherein
the fifth resonator includes:
a third capacitor that is connected between a third node and the input terminal;
a sixth inductor including a first end that is connected to the third node;
a seventh inductor that is connected with a second end of the sixth inductor; and
a common inductor that is connected between the second end of the seventh inductor and the ground terminal;
the seventh resonator includes:
a sixth capacitor that is connected between a fourth node and the output terminal;
an eighth inductor including a first end that is connected to the fourth node; and
a ninth inductor that is connected between a second end of the eighth inductor and the common inductor; and
the filter device further includes a tenth inductor that is connected between the second end of the sixth inductor and the second end of the eighth inductor.

11. The filter device according to claim 10, further comprising:
a fifth capacitor that is connected with the fifth resonator and the seventh resonator.

12. A high-frequency front-end circuit comprising:
the filter device according to claim 1.

13. A high-frequency front-end circuit comprising:
the filter device according to claim 6.

14. A high-frequency front-end circuit comprising:
the filter device according to claim 8.

15. A high-frequency front-end circuit comprising:
the filter device according to claim 10.

16. The filter device according to claim 3, further comprising:
a third resonator that is connected with the input terminal and is electro-magnetically coupled with the first resonator; and
a fourth resonator that is connected with the output terminal and is electro-magnetically coupled with the second resonator.

17. The filter device according to claim 3, wherein the filter device is a band pass filter to allow a signal of a specific frequency band to pass therethrough.

18. A high-frequency front-end circuit comprising:
the filter device according to claim 3.

19. The filter device according to claim 1, wherein
an annular structure is defined by the second path of the first resonator, the second path of the second resonator, and the third path;
the main body includes a plurality of dielectric layers that are laminated; and
the annular structure is located on one layer of the main body.

20. The filter device according to claim 3, wherein
an annular structure is defined by the second path of the first resonator, the second path of the second resonator, and the third path; and
the annular structure is located over a plurality of the plurality of dielectric layers of the main body.

* * * * *